(12) United States Patent
Tsou

(10) Patent No.: US 8,283,790 B2
(45) Date of Patent: Oct. 9, 2012

(54) ELECTRONIC DEVICE

(75) Inventor: Wen-Chieh Tsou, Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 148 days.

(21) Appl. No.: 12/691,716

(22) Filed: Jan. 21, 2010

(65) Prior Publication Data
US 2010/0187561 A1 Jul. 29, 2010

(30) Foreign Application Priority Data
Jan. 23, 2009 (TW) .............................. 98102946 A

(51) Int. Cl.
*H01L 33/00* (2010.01)
*H01L 23/495* (2006.01)
*H01L 23/498* (2006.01)

(52) U.S. Cl. ........ 257/786; 257/668; 257/693; 257/735; 257/779; 257/E33.057; 257/E33.065; 257/E23.031; 257/E23.06; 257/E23.061; 257/E23.068

(58) Field of Classification Search ................... 257/668, 257/693, 735, 779, 786, E33.057, E33.065, 257/E23.031, E23.06, E23.061, E23.068
See application file for complete search history.

(56) References Cited

U.S. PATENT DOCUMENTS

| 6,989,294 | B1 | 1/2006 | McLellan et al. |
| 7,038,327 | B2 * | 5/2006 | Ho et al. ........................ 257/786 |
| 2002/0125584 | A1 * | 9/2002 | Umehara et al. .............. 257/786 |
| 2004/0046180 | A1 * | 3/2004 | Takaoka .......................... 257/98 |
| 2004/0084779 | A1 * | 5/2004 | Huang et al. ................... 257/773 |
| 2004/0135246 | A1 | 7/2004 | Kim et al. |
| 2008/0265411 | A1 * | 10/2008 | Hu ................................ 257/737 |
| 2009/0315064 | A1 * | 12/2009 | Wang .............................. 257/99 |
| 2010/0252924 | A1 * | 10/2010 | Kanaoka et al. .............. 257/737 |

FOREIGN PATENT DOCUMENTS
CN 1874650 12/2006
* cited by examiner

*Primary Examiner* — Victor A Mandala
(74) *Attorney, Agent, or Firm* — Jianq Chyun IP Office

(57) ABSTRACT

An electronic device includes a carrier, a surface mounting device, and solders. The carrier has a plurality of bonding pads, and at least one of the bonding pads has a notch, such that the bonding pad has a necking portion adjacent to the notch. The surface mounting device is disposed on the carrier. Besides, the surface mounting device has a plurality of leads, and each of the leads is connected to the necking portion of one of the bonding pads, respectively. The notch of each of the bonding pads is located under one of the leads. The solders connect the bonding pads and the leads.

20 Claims, 10 Drawing Sheets

ELECTRONIC DEVICE

CROSS-REFERENCE TO RELATED APPLICATION

This application claims the priority benefit of Taiwan application serial No. 98102946, filed on Jan. 23, 2009. The entirety of the above-mentioned patent application is hereby incorporated by reference herein and made a part of this specification.

BACKGROUND OF THE INVENTION

1. Field of the Invention

The present invention relates to an electronic device, and more particularly to an electronic device having bonding pads in special shapes.

2. Description of Related Art

In semiconductor industry, the production of integrated circuits (ICs) mainly includes three stages: wafer manufacturing, IC manufacturing, and IC package. Chips are produced through the steps of wafer manufacturing, circuit designing, circuit manufacturing, wafer sawing, and so on. Each chip formed by wafer sawing is electrically connected to an external carrier through bonding pads on the chip, and the chip is packaged, so as to prevent the chip from being influenced by humidity, heat, and noise. The external carrier can be a chip carrying substrate or a lead frame. When a chip is electrically connected to the lead frame, a plurality of leads comprised by the lead frame can be extended out of a chip package, so as to electrically connect an external circuit board (or other electronic devices). Besides, the leads and the bonding pads on the circuit board can be connected by solder. Nonetheless, when a contact area between the leads and the bonding pads is over large, a surplus amount of solder attaching to the leads is increased, and therefore the solder is apt to enter the chip package from solder-attached parts of the leads, which is performed along the leads. Thereby, the chip package is likely to be damaged.

SUMMARY OF THE INVENTION

The present invention is directed to an electronic device featuring favorable reliability.

The present invention is further directed to an electronic device capable of effectively decreasing the possibility that the solder enters a chip package from solder-attached parts of its own leads, which is performed along the leads.

In the present invention, an electronic device including a carrier, a surface mounting device, and a plurality of solders is provided. The carrier has a plurality of bonding pads, and at least one of the bonding pads has a notch, such that the bonding pad has a necking portion adjacent to the notch. The surface mounting device is disposed on the carrier. Besides, the surface mounting device has a plurality of leads, and each of the leads is connected to the necking portion of one of the bonding pads, respectively. The notch of each of the bonding pads is located under the corresponding one of the leads. The solders connect the bonding pads and the leads.

According to an embodiment of the present invention, the carrier includes a circuit substrate, and the bonding pads are disposed on the circuit substrate.

According to an embodiment of the present invention, the surface mounting device includes a chip, a lead frame, and a molding body. The lead frame has the leads. The chip is electrically connected to the leads. The molding body encapsulates the chip and a portion of the lead frame.

According to an embodiment of the present invention, exposed parts of the leads which are not covered by the molding body are bended and extended away from the molding body.

According to an embodiment of the present invention, exposed parts of the leads which are not covered by the molding body are bended and extended under the bottom of the molding body.

According to an embodiment of the present invention, the chip is a light emitting diode (LED) chip.

According to an embodiment of the present invention, the notch of one of the bonding pads has a polygonal shape or an arc shape.

According to an embodiment of the present invention, the polygonal shape includes a triangular shape, a rectangular shape, a trapezoid shape, a pentagonal shape, or a hexagonal shape.

According to an embodiment of the present invention, the arc shape includes a semi-circular shape, a semi-elliptic shape, or a U shape.

In the present invention, an electronic device including a carrier, a surface mounting device, and a plurality of solders is provided. The carrier has a plurality of bonding pads. Each of the bonding pads has a first soldering portion and a second soldering portion separated and exposed on the carrier, and the first soldering portion is separated from the second soldering portion. The surface mounting device is disposed on the carrier and has a plurality of leads. Each of the leads is connected to the first soldering portion and the second soldering portion of the corresponding one of the bonding pads, and the solders connect the bonding pads and the leads.

According to an embodiment of the present invention, the surface mounting device includes a chip, a lead frame, and a molding body. The lead frame has the leads. The chip is electrically connected to the leads. The molding body encapsulates the chip and a portion of the lead frame.

According to an embodiment of the present invention, exposed parts of the leads which are not covered by the molding body are bended and extended away from the molding body.

According to an embodiment of the present invention, parts of the leads which are not covered by the molding body are bended and extended under the bottom of the molding body.

According to an embodiment of the present invention, the chip is an LED chip.

According to an embodiment of the present invention, one of the leads has a first corner and a second corner that are both located outside the molding body, and the first soldering portion and the second soldering portion of one of the bonding pads are respectively connected to the first corner and the second corner.

According to an embodiment of the present invention, one of the leads has a first side and a second side, and the first soldering portion and the second soldering portion of one of the bonding pads are respectively adjacent to the first side and the second side.

According to an embodiment of the present invention, the first soldering portion and the second soldering portion have a polygonal shape or an arc shape.

According to an embodiment of the present invention, the polygonal shape includes a triangular shape, a rectangular shape, a trapezoid shape, a pentagonal shape, or a hexagonal shape.

According to an embodiment of the present invention, the arc shape includes a circular shape, a semi-circular shape, an elliptic shape, or a semi-elliptic shape.

In the present invention, a circuit board for carrying a surface mounting device having at least one lead, the circuit board comprising: a base; and a soldering pad exposed on the base for soldering to the lead of the surface mounting device, wherein the soldering pad comprises a necking portion within an area for soldering.

In the present invention, a circuit board for carrying a surface mounting device having at least one lead, the circuit board comprising: a base; and a soldering pad exposed on the base for soldering to the lead of the surface mounting device, the soldering pad comprising at least two separated soldering portions spanning a distance corresponding to the lead in width.

In light of the foregoing, the contact area between the leads and the bonding pads is reduced by forming a notch on each of the bonding pads or by dividing the bonding pads not covered by the carrier into two separated portions. Besides, the solder-wetting amount of the leads can be reduced as well. Therefore, the conventional issue that surplus amounts of the solder attaching to the leads may enter the chip package along its own leads can be resolved.

In order to make the above and other objects, features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
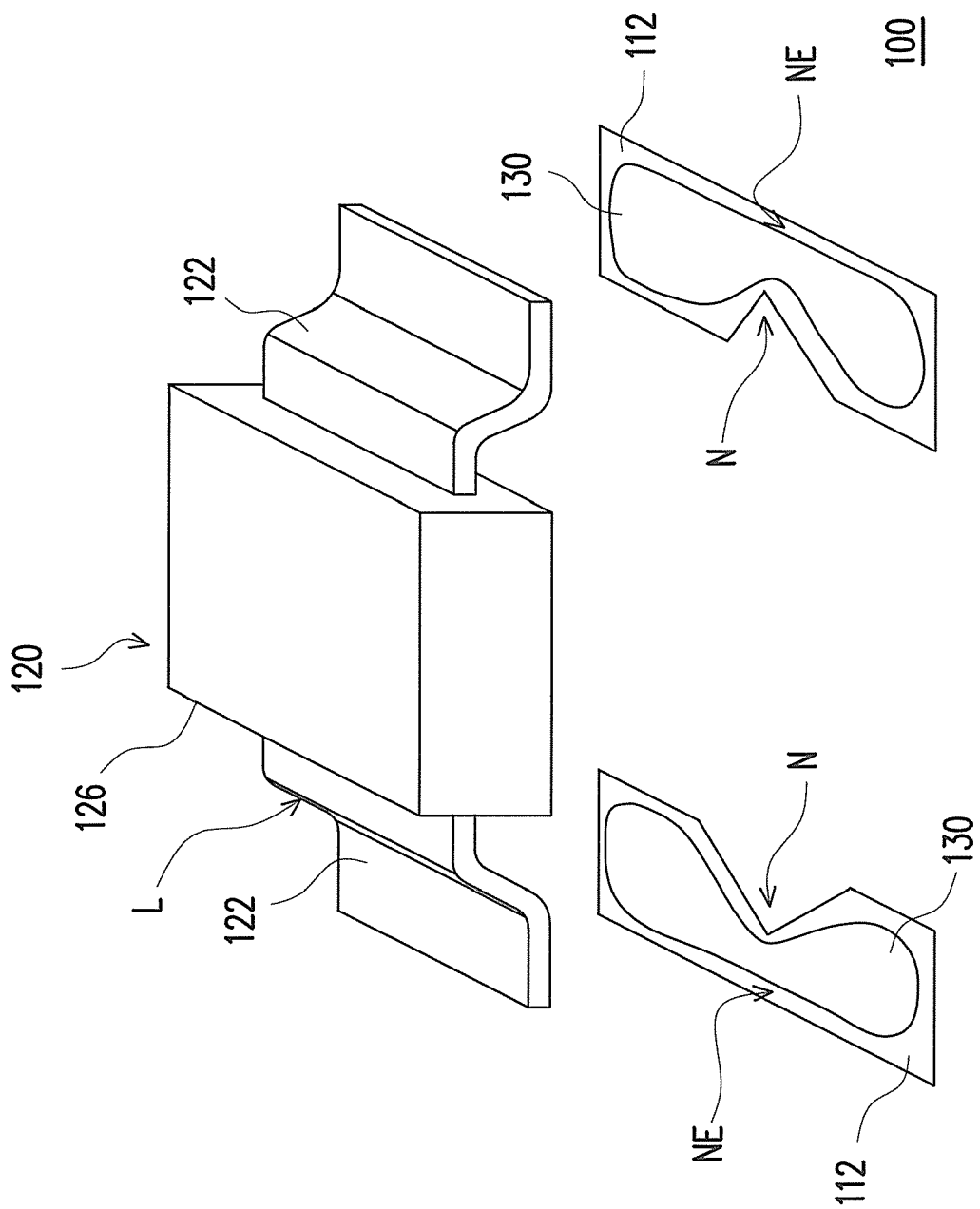
FIG. 1A is an exploded view of an electronic device according to an embodiment of the present invention.
Figure 1B:
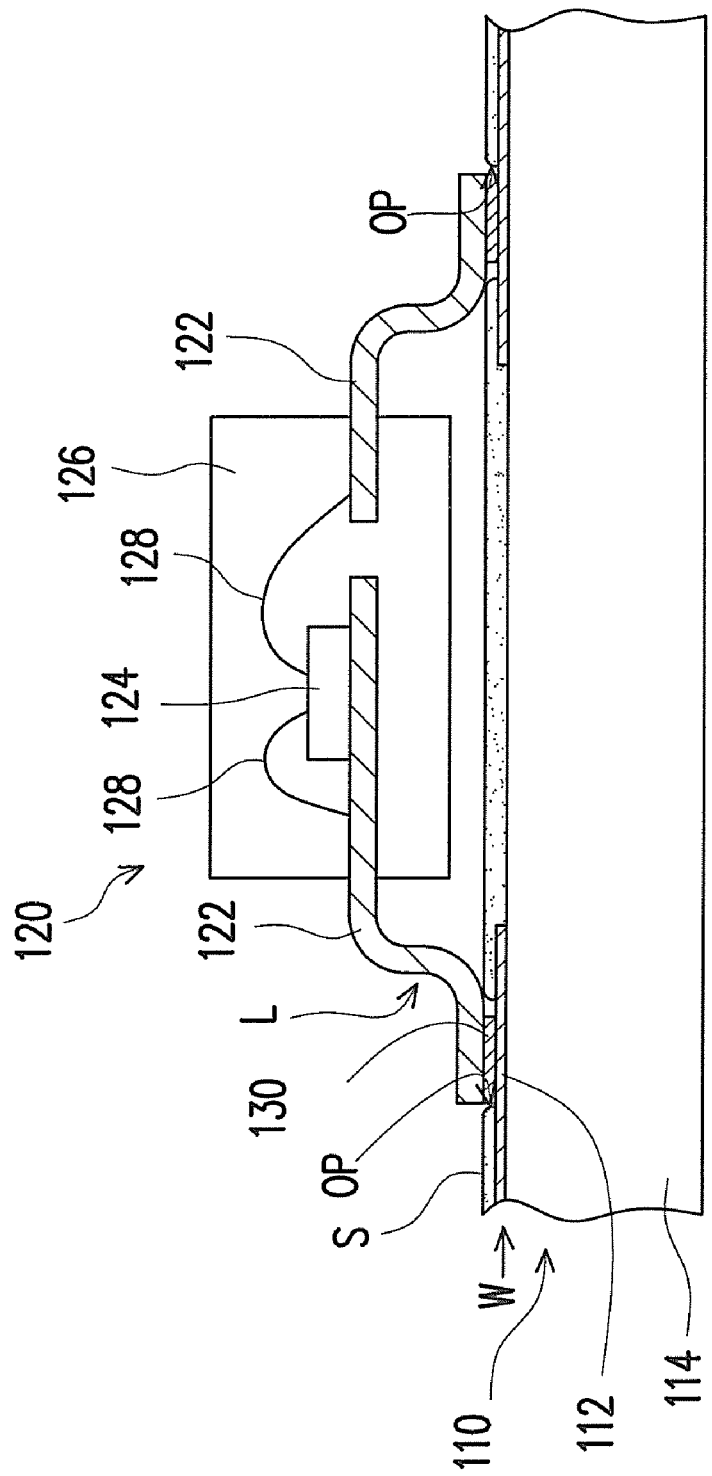
FIG. 1B is a cross-sectional view of the electronic device depicted in FIG. 1A.
Figure 1D:
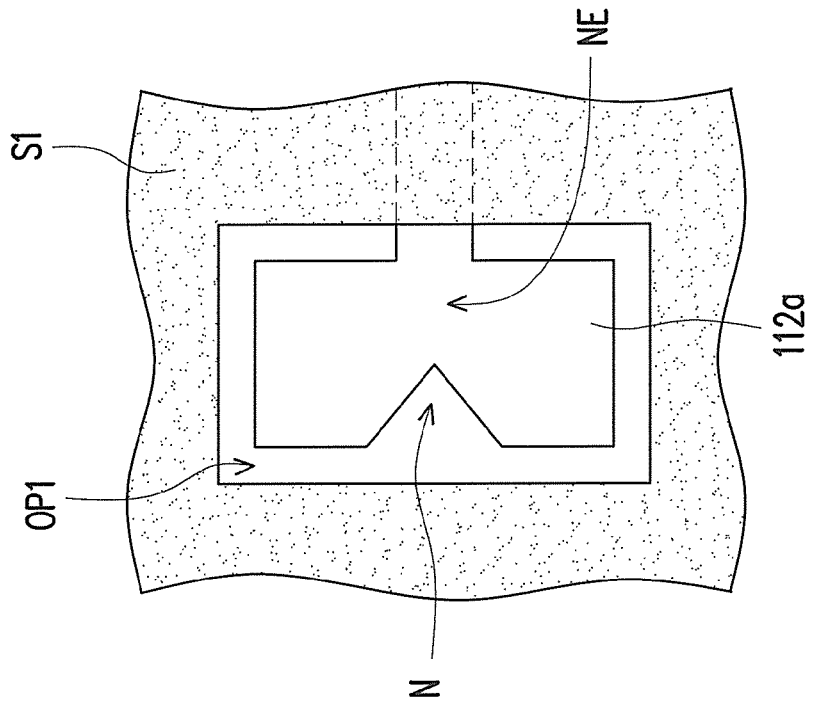
FIG. 1D is a top view illustrating a varied structure of the bonding pads depicted in FIG. 1C.
Figure 1C:
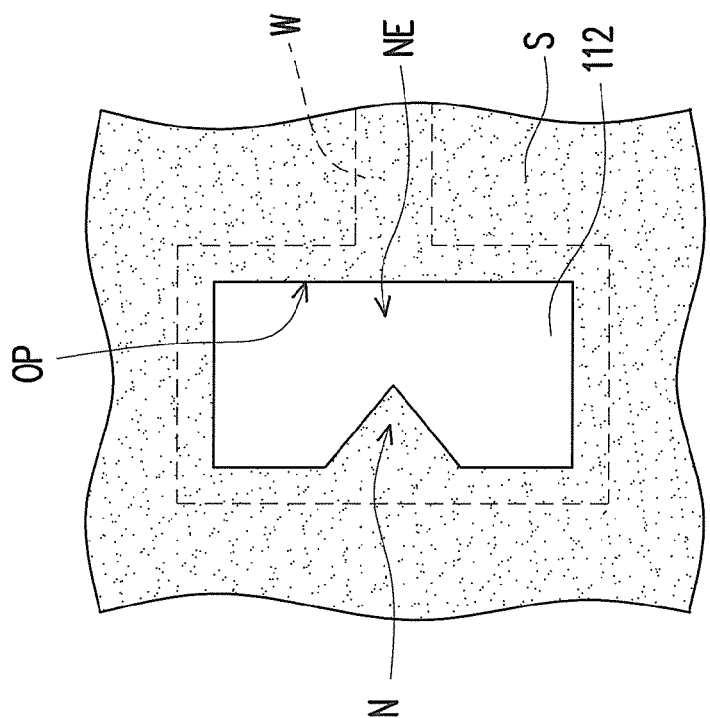
FIG. 1C is a top view of bonding pads depicted in FIG. 1B.
Figure 2A:
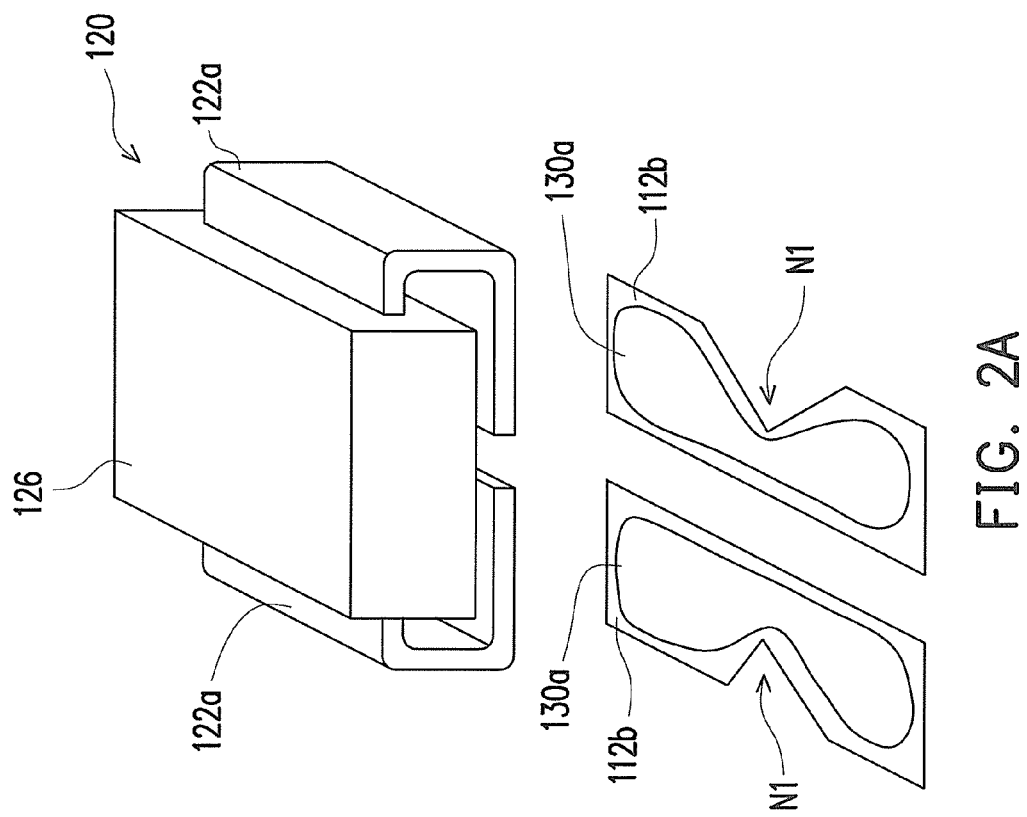
FIG. 2A is an exploded view of an electronic device according to another embodiment of the present invention.
Figure 2B:
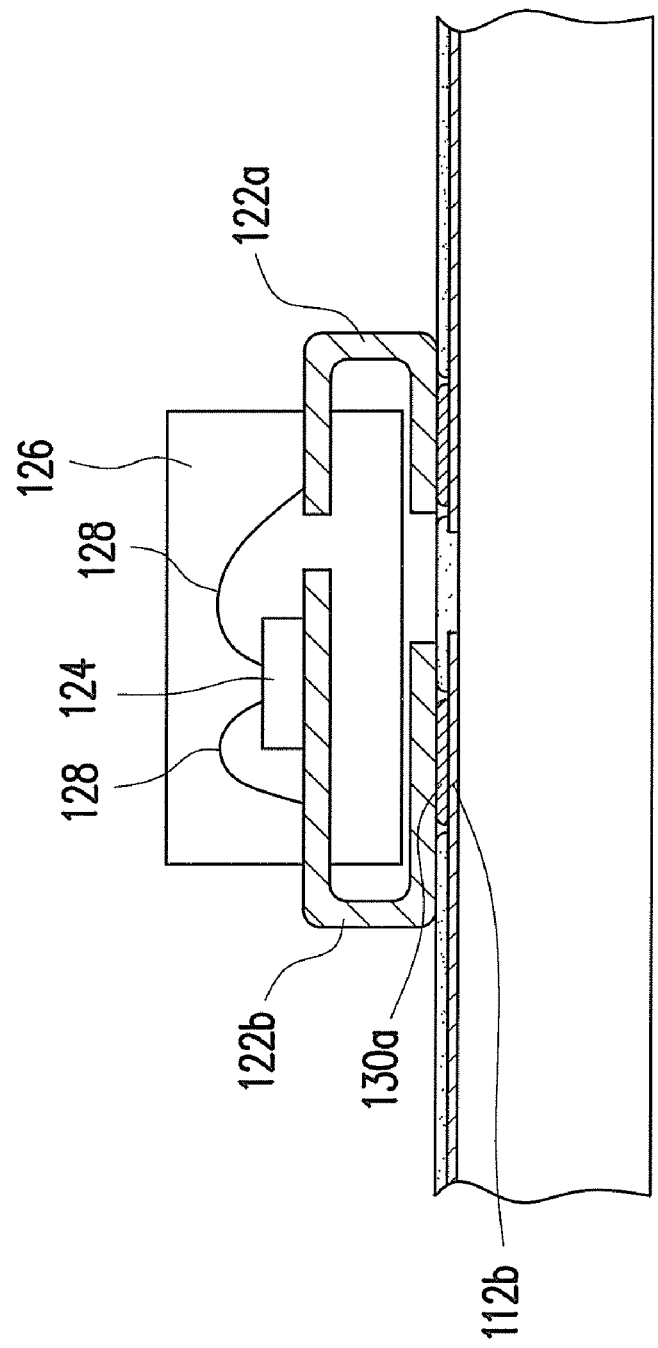
FIG. 2B is a cross-sectional view of the electronic device depicted in FIG. 2A.

FIG. 1A is an exploded view of an electronic device according to an embodiment of the present invention. FIG. 1B is a cross-sectional view of the electronic device depicted in FIG. 1A. FIG. 1C is a top view of bonding pads depicted in FIG. 1B. FIG. 1D is a top view illustrating a varied structure of the bonding pads depicted in FIG. 1C. FIG. 2A is an exploded view of an electronic device according to another embodiment of the present invention. FIG. 2B is a cross-sectional view of the electronic device depicted in FIG. 2A.

Referring to FIGS. 1A, 1B, and 1C, the electronic device 100 of the present embodiment includes a carrier 110, a surface mounting device 120, and a plurality of solders 130. The carrier 110 has a plurality of bonding pads 112. Besides, in the present embodiment, the carrier 110 can be a circuit substrate, and the bonding pads 112 are disposed on the circuit substrate. In addition, the circuit substrate can be a single-layer circuit board or a multi-layer circuit board.

According to the present embodiment, the carrier 110 can further have a base layer 114, a circuit layer W, and a solder mask layer S. The circuit layer W has the bonding pads 112 and is disposed on the base layer 114. The solder mask layer S covers the circuit layer W. Besides, the solder mask layer S can have a plurality of openings OP exposing the bonding pads 112.

Note that the bonding pads 112 are defined by the openings OP in the present embodiment. That is to say, parts of the circuit layer W exposed by the openings OP form the bonding pads 112. To better describe the present invention, the base layer 114 and the solder mask layer S of the carrier 110 are omitted in FIG. 1A, while only the bonding pads 112 are illustrated thereon.

At least one of the bonding pads 112 has a notch N, such that the bonding pad 112 has a necking portion NE adjacent to the notch N. In the present embodiment, the notch N has a polygonal shape, an arc shape, or any other appropriate shape, for example. Here, the polygonal shape can be a triangular shape, a rectangular shape, a trapezoid shape, a pentagonal shape, or a hexagonal shape. The arc shape can be a semi-circular shape, a semi-elliptic shape, or a U shape.

Referring to FIG. 1C, in the present embodiment, the bonding pads 112 and the openings OP can be in the same shape. By contrast, referring to FIG. 1D, in other embodiments, the bonding pads 112a can have a shape different from that of first openings OP1 of a solder mask layer S1.

It can be learned from FIG. 1B that the surface mounting device 120 is disposed on the carrier 110. The surface mounting device 120 has a plurality of leads 122, and the leads 122 are connected to the necking portions NE of the bonding pads 112 respectively. The notch N of each of the bonding pads 112 is located under the corresponding one of the leads 122. Moreover, the solders 130 connect the bonding pads 112 and the leads 122. In addition, FIGS. 1a-1d merely depict two leads 122 and two bonding pads 112, which should not be construed as a limitation to the present invention. For instance, the number of the leads 122 and the number of the bonding pads 112 can also be two or more in the present embodiments.

It should be mentioned that each of the bonding pads 112 of the present embodiment, in comparison with the conventional bonding pads, has a notch N located under the leads 122, so as to appropriately reduce a contact area between the leads 122 and the bonding pads 112 and to further prevent from a surplus amount of the solder attaching to the leads 122. As such, by utilizing the electronic device 100 of the present embodiment, a conventional issue that surplus amounts of the solder attaching to the leads may enter a chip package along its own leads can be resolved. In addition, since the notch N makes the path for the solders 130 entering the electronic device 100 longer, the notch N can effectively decreases the possibility that the solders 130 enter the electronic device 100, so as to improve reliability of the electronic device 100.

In the present embodiment, the surface mounting device 120 further includes a chip 124, a lead frame L, and a molding body 126. The lead frame L includes the leads 122, and the chip 124 disposed on the lead frame L is electrically connected to the two leads 122 through two respective conductive wires 128. The chip 124 is, for example, an LED chip or any other chip suitable to be electrically connected to the leads 122. According to other embodiments, the lead frame L further comprises a chip carrying base for carrying the chip 124. The molding body 126 encapsulates the chip 124, the conductive wires 128, and a portion of the lead frame L adjacent to the chip 124. Besides, in the present embodiment, exposed parts of the leads 122 which are not covered by the molding body 126 can be bended and extended away from the molding body 126. Alternatively, referring to FIGS. 2A and 2B, in other embodiments, the exposed parts of leads 122a which are not covered by the molding body 126 can also be bended and extended under the bottom of the molding body 126. Additionally, each of bonding pads 112b further has a notch N1 for disposing under a corresponding one of the leads 122a.

Figure 3A:
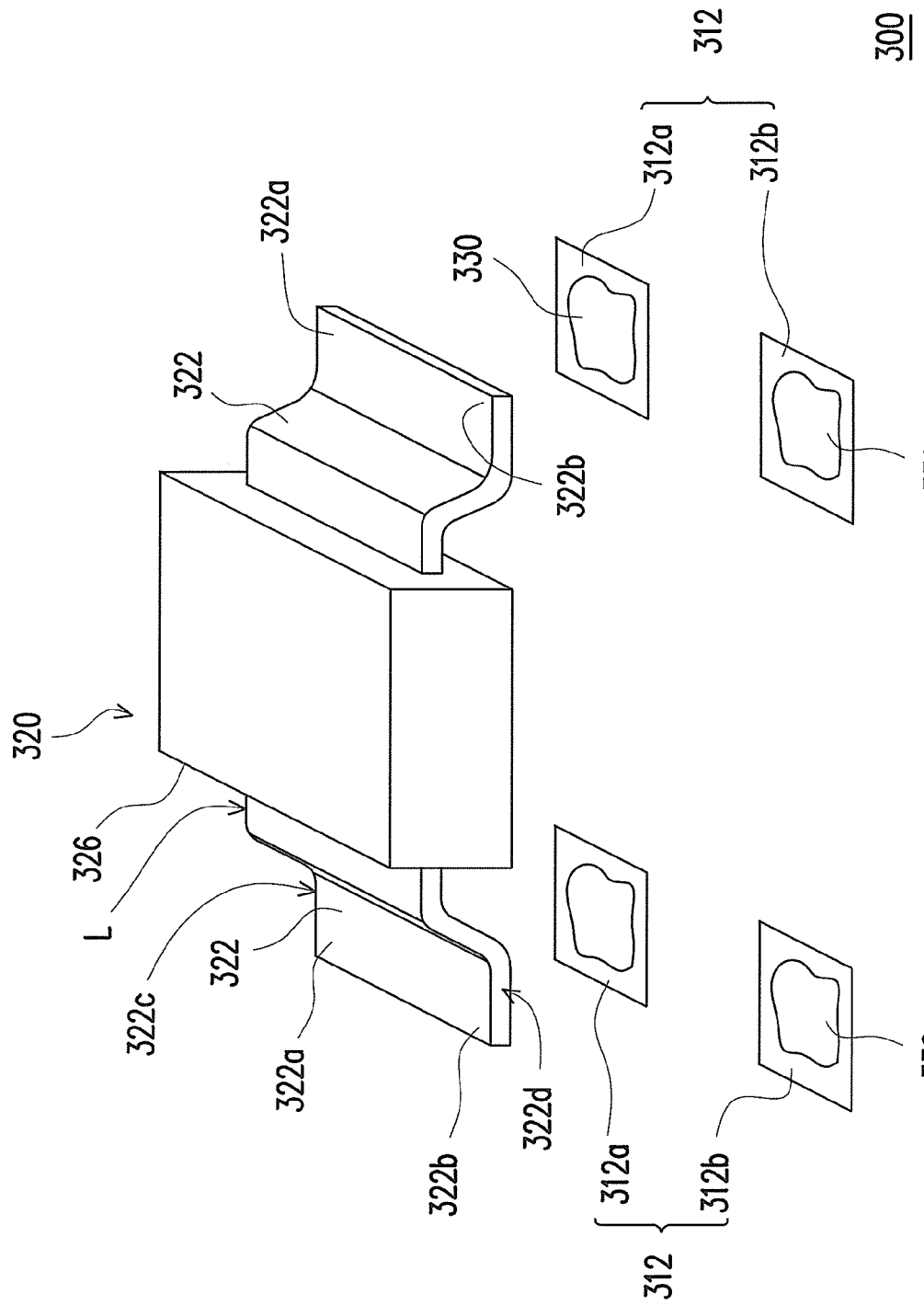
FIG. 3A is an exploded view of an electronic device according to an embodiment of the present invention.
Figure 3B:
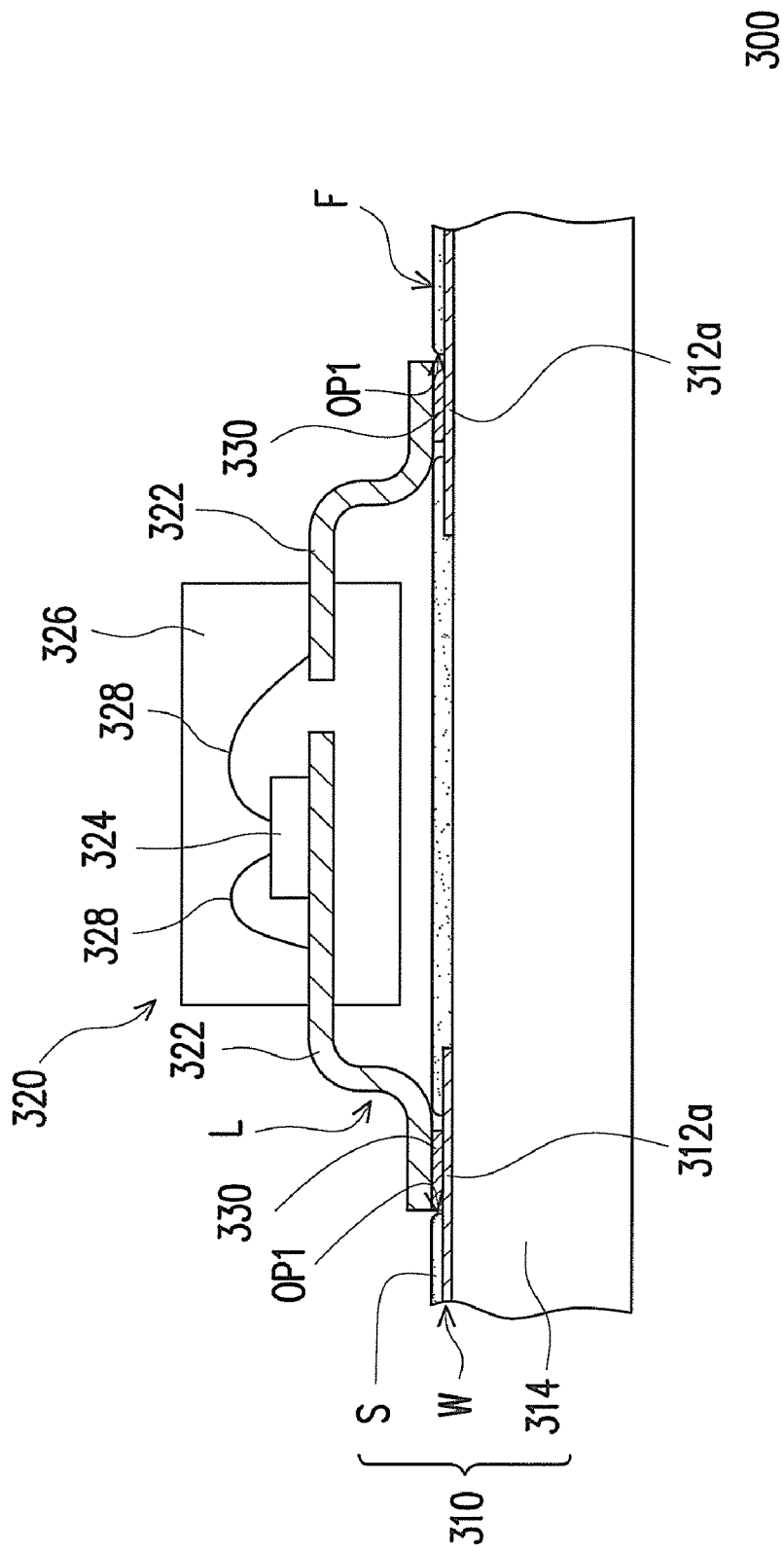
FIG. 3B is a cross-sectional view of the electronic device depicted in FIG. 3A.
Figure 3D:
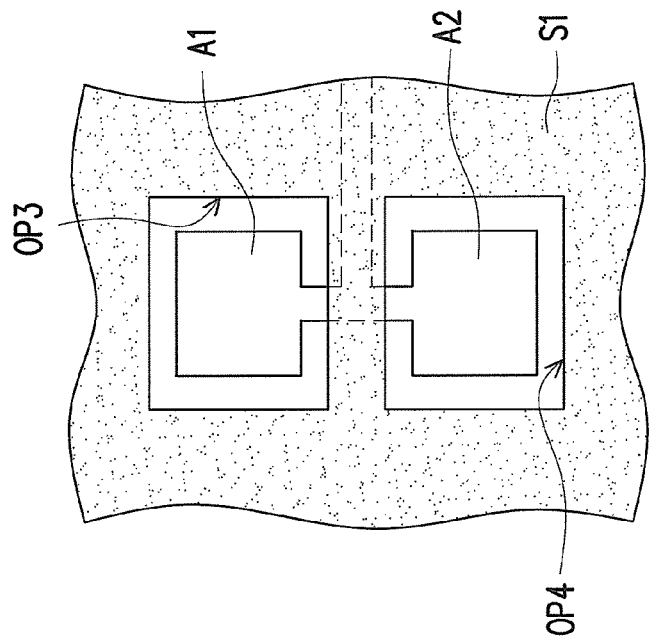
FIG. 3D is a top view illustrating a varied structure of the bonding pads depicted in FIG. 3C.
Figure 3C:
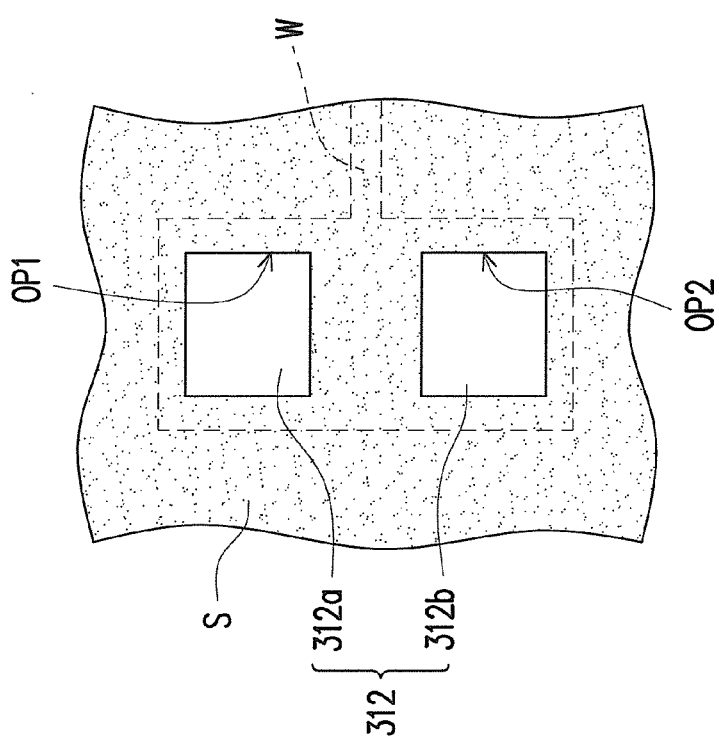
FIG. 3C is a top view of bonding pads depicted in FIG. 3B.
Figure 4A:
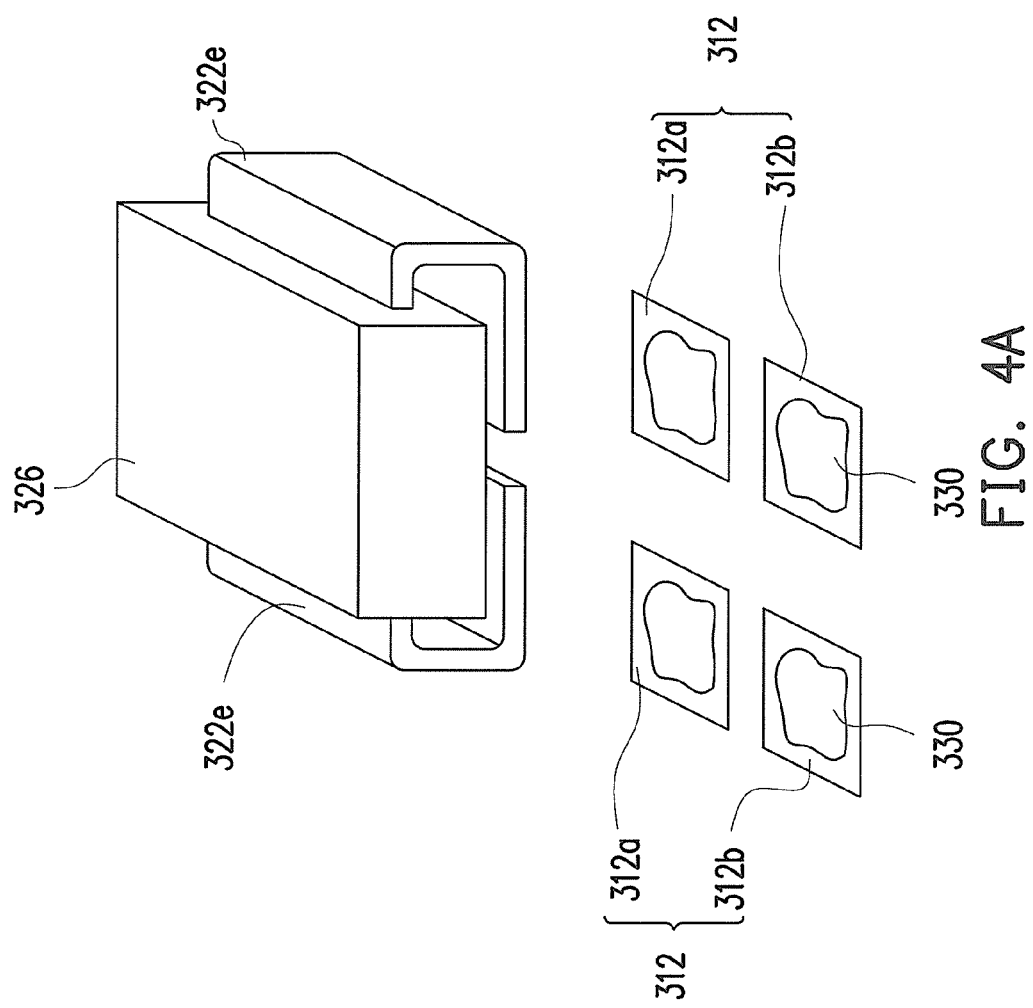
FIG. 4A is an exploded view of an electronic device according to another embodiment of the present invention.
Figure 4B:
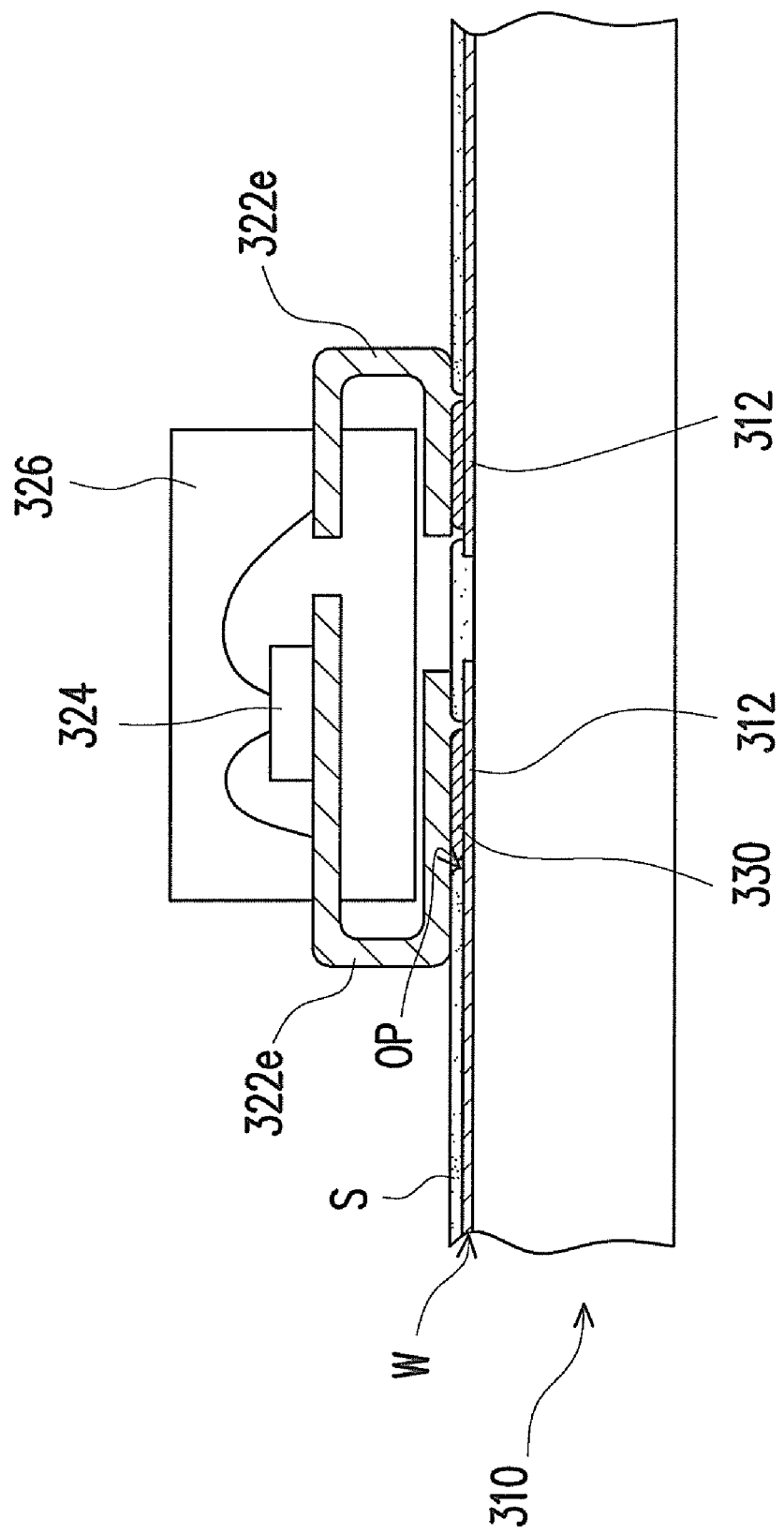
FIG. 4B is a cross-sectional view of the electronic device depicted in FIG. 4A.

FIG. 3A is an exploded view of an electronic device according to an embodiment of the present invention. FIG. 3B is a cross-sectional view of the electronic device depicted in FIG. 3A. FIG. 3C is a top view of bonding pads depicted in FIG. 3B. FIG. 3D is a top view illustrating a varied structure of the bonding pads depicted in FIG. 3C. FIG. 4A is an exploded view of an electronic device according to another embodiment of the present invention. FIG. 4B is a cross-sectional view of the electronic device depicted in FIG. 4A.

Referring to FIGS. 3A, 3B, and 3C, the electronic device 300 of the present embodiment includes a carrier 310, a surface mounting device 320, and a plurality of solders 330 for connecting the carrier 310 and the surface mounting device 320. The carrier 310 has a plurality of bonding pads 312, and each of the bonding pads 312 has a first soldering portion 312a and a second soldering portion 312b which are exposed by a surface F of the carrier 310. The first soldering portion 312a is electrically connected to the second soldering portion 312b, while the first soldering portion 312a and the second soldering portion 312b exposed by the surface F of the carrier 310 are spaced from each other. In the present embodiment, the carrier 310 can be a circuit substrate, and the circuit substrate can be a single-layer circuit board or a multi-layer circuit board. Besides, the bonding pads 312 are disposed on the circuit substrate.

To be more specific, the carrier 310 of the present embodiment has a base layer 314, a circuit layer W, and a solder mask layer S. The circuit layer W comprises the bonding pads 312. The solder mask layer S has a plurality of first openings OP1 and a plurality of second openings OP2 respectively exposing the first soldering portions 312a and the second soldering portions 312b of the bonding pads 312. To better describe the present invention, the base layer 314 and the solder mask layer S of the carrier 310 are omitted in FIG. 3A, while only the first soldering portions 312a and the second soldering portions 312b are illustrated thereon.

Note that the first soldering portions 312a and the second soldering portions 312b of the bonding pads 312 are defined by the first openings OP1 and the second openings OP2 respectively in the present embodiment. That is to say, parts of the circuit layer W exposed by the first openings OP1 and the second openings OP2 are the first soldering portions 312a and the second soldering portions 312b, respectively. In addition, the first soldering portions 312a and the second soldering portions 312b can be electrically connected through the other parts of the circuit layer W covered by the solder mask layer S.

The first soldering portions 312a and the second soldering portions 312b can be a polygonal shape, a circular shape, a semi-circular shape, an elliptic shape, or a semi-elliptic shape, for example. Here, the polygonal shape can be a triangular shape, a rectangular shape, a trapezoid shape, a pentagonal shape, or a hexagonal shape.

Referring to FIG. 3C, in the present embodiment, the first soldering portion 312a and the first openings OP1 are in the same shape and size, while the second soldering portion 312b and the second openings OP2 are in the same shape and size. On the other hand, referring to FIG. 3D, in other embodiments, first soldering portions A1 have a size different from that of third openings OP3 of a solder mask layer S1, and second soldering portions A2 have a size different from that of fourth openings OP4.

The surface mounting device 320 is disposed on the carrier 310. Besides, the surface mounting device 320 has a plurality of leads 322. Each of the leads 322 is respectively connected to the first soldering portion 312a and the second soldering portion 312b of one of the bonding pads 312, and the solders 330 connect the bonding pads 312 and the leads 322. In addition, according to the present embodiment, one of the leads 322 has a first corner 322a and a second corner 322b, and the first soldering portion 312a and the second soldering portion 312b of one of the bonding pads 312 are respectively connected to the first corner 322a and the second corner 322b. On the other hand, according to the present embodiment, one of the leads 322 has a first side 322c and a second side 322d, and the first soldering portion 312a and the second soldering portion 312b of one of the bonding pads 312 are respectively adjacent to the first side 322c and the second side 322d. Additionally, FIGS. 3A-3D merely depict two leads 322 and two bonding pads 312, which should not be construed as a limitation to the present invention. For instance, the number of the leads 322 and the number of the bonding pads 312 can also be two or more in the present embodiment.

Compared to the related art, the present embodiment teaches that parts of the bonding pads 312 not covered by the surface F of the carrier 310 can be divided into the first soldering portion 312a and the second soldering portion 312b separated from each other, and therefore a contact area between the bonding pads 312 and the leads 322 is relatively small. As such, according to the present embodiment, the amount of solder attaching to the leads can be reduced, and the conventional issue that surplus amounts of the solder attaching to the leads may enter the chip package along its own leads can be resolved as well.

Moreover, in the present embodiment, the surface mounting device 320 includes a chip 324, a lead frame L, and a molding body 326. The lead frame L can have the leads 322. The chip 324, for example, disposed on the lead frame L is electrically connected to the two leads 322 through two respective conductive wires 328. The molding body 326 can encapsulate the chip 324, the two conductive wires 328, and a portion of the lead frame L adjacent to the chip 324. The chip 324 is, for example, an LED chip or any other chip suitable to be electrically connected to the leads 322. Besides, in the present embodiment, exposed parts of the leads 322 which are not covered by the molding body 326 are, for example, bended and extended away from the molding body 326. By contrast, referring to FIGS. 4A and 4B, in other embodiments, exposed parts of leads 322e which are not covered by the molding body 326 are, for example, bended and extended under the bottom of the molding body 326.

In light of the foregoing, the contact area between the leads and the bonding pads is reduced by forming a notch on each of the bonding pads or by dividing the bonding pads not covered by the carrier into two separated portions. Accordingly, the solder-wetting amount of the leads can be reduced as well. Therefore, the conventional issue that surplus amounts of the solder attaching to the leads may enter the chip package along its own leads can be resolved. In addition, since the notch makes the path for the solders entering the electronic device longer, the notch can effectively decreases the possibility that the solders enter the electronic device, so as to improve reliability of the electronic device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device, comprising:
    a carrier having a plurality of bonding pads, wherein at least one of the bonding pads has a notch located at one side edge of the bonding pad, such that the bonding pad has a necking portion adjacent to the notch;
    a surface mounting device disposed on the carrier and having a plurality of leads, wherein each of the leads is connected to the necking portion of one of the bonding pads, respectively, and the notch of each of the bonding pads is located under one of the leads; and
    a plurality of solders connecting the bonding pads and the leads.

2. The electronic device as claimed in claim 1, wherein carrier comprises a circuit substrate, and the bonding pads are disposed on the circuit substrate.

3. The electronic device as claimed in claim 1, wherein the surface mounting device comprises a chip, a lead frame, and a molding body, the lead frame has the leads, the chip is electrically connected to the leads, and the molding body encapsulates the chip and a portion of the lead frame.

4. The electronic device as claimed in claim 3, wherein parts of the leads not covered by the molding body are bent and extended away from the molding body.

5. The electronic device as claimed in claim 3, wherein parts of the leads not covered by the molding body are bent and extended under the bottom of the molding body.

6. The electronic device as claimed in claim 3, wherein the chip is a light emitting diode chip.

7. The electronic device as claimed in claim 1, wherein the notch of one of the bonding pads has a polygonal shape or an arc shape.

8. The electronic device as claimed in claim 7, wherein the polygonal shape comprises a triangular shape, a rectangular shape, a trapezoid shape, a pentagonal shape, or a hexagonal shape.

9. The electronic device as claimed in claim 7, wherein the arc shape comprises a semi-circular shape, a semi-elliptic shape, or a U shape.

10. An electronic device, comprising:
    a carrier having a base layer, a solder mask layer covering the base layer and a plurality of bonding pads located on the base layer, each of the bonding pads having a first soldering portion and a second soldering portion and the first and second soldering portions are exposed by openings of the solder mask layer and are spaced apart;
    a surface mounting device disposed on the carrier and having a plurality of leads, wherein each of the leads is connected to the first soldering portion and the second soldering portion of the corresponding one of the bonding pads; and
    a plurality of solders connecting the bonding pads and the leads.

11. The electronic device as claimed in claim 10, wherein the surface mounting device comprises a chip, a lead frame, and a molding body, the lead frame has the leads, the chip is electrically connected to the leads, and the molding body encapsulates the chip and a portion of the lead frame.

12. The electronic device as claimed in claim 11, wherein parts of the leads not covered by the molding body are bent and extended away from the molding body.

13. The electronic device as claimed in claim 11, wherein parts of the leads not covered by the molding body are bent and extended under the bottom of the molding body.

14. The electronic device as claimed in claim 11, wherein the chip is a light emitting diode chip.

15. The electronic device as claimed in claim 10, wherein one of the leads has a first corner and a second corner, and the first soldering portion and the second soldering portion of one of the bonding pads are respectively connected to the first corner and the second corner.

16. The electronic device as claimed in claim 10, wherein one of the leads has a first side and a second side, and the first soldering portion and the second soldering portion of one of the bonding pads are respectively adjacent to the first side and the second side.

17. The electronic device as claimed in claim 10, wherein the first soldering portion and the second soldering portion have a polygonal shape, a circular shape, a semi-circular shape, an elliptic shape, or a semi-elliptic shape.

18. The electronic device as claimed in claim 17, wherein the polygonal shape comprises a triangular shape, a rectangular shape, a trapezoid shape, a pentagonal shape, or a hexagonal shape.

19. A circuit board for carrying a surface mounting device having at least one lead, the circuit board comprising:
    a base;
    a solder mask layer, covering the base; and
    at least a bonding pad exposed by the solder mask layer and located on the base for soldering to the lead of the surface mounting device, wherein the bonding pad comprises a notch located at one side edge of the bonding pad and a necking portion within an area for soldering.

20. A circuit board for carrying a surface mounting device having at least one lead, the circuit board comprising:
    a base;
    a soldering mask layer, covering the base; and
    at least a bonding pad exposed by the solder mask layer and located on the base for soldering to the lead of the surface mounting device, the bonding pad comprising at least two separated soldering portions spanning a distance corresponding to the lead in width.

* * * * *